United States Patent [19]
Eriksson et al.

[11] 3,986,128
[45] Oct. 12, 1976

[54] PHASE SELECTIVE DEVICE

[75] Inventors: Leif Eriksson; Lennart Thornell, both of Vasteras, Sweden

[73] Assignee: Allmanna Svenska Elektriska Aktiebolaget, Vasteras, Sweden

[22] Filed: Aug. 14, 1975

[21] Appl. No.: 604,713

[30] Foreign Application Priority Data
Sept. 19, 1974 Sweden .............................. 7411769

[52] U.S. Cl. .............................. 328/133; 307/215; 307/291
[51] Int. Cl.² ......................................... H03D 13/00
[58] Field of Search ............. 328/133; 307/291, 215

[56] References Cited
UNITED STATES PATENTS

| | | | |
|---|---|---|---|
| 2,985,773 | 5/1961 | Dobbie .......................... | 328/133 X |
| 3,016,469 | 1/1962 | Barrett ........................... | 307/291 X |
| 3,041,477 | 6/1962 | Budts et al. ..................... | 307/291 X |
| 3,328,688 | 6/1967 | Brooks ........................... | 328/133 X |
| 3,610,954 | 10/1971 | Treadway ...................... | 328/133 X |

*Primary Examiner*—John S. Heyman

[57] ABSTRACT

An arrangement for determining the phase position between two signals includes a circuit containing a gate with two inputs for the signals and an output for a first output signal which is dependent on the phase position between the input signals. A flip-flop has an input for one of the input signals and a second input for the first output signal. The second input of the flip-flop contains a time-delay circuit for the first output signal. Two similar circuits can be used.

3 Claims, 4 Drawing Figures

PHASE SELECTIVE DEVICE

BACKGROUND OF THE INVENTION

Field of the Invention

The present invention relates to a device for determining the phase position between at least two signals. These signals may correspond to the alternating voltage or alternating current, respectively, of a power line network and the device may be used in direction-sensing devices in line protection arrangements.

SUMMARY OF THE INVENTION

According to the invention, a time-delay circuit is connected with the second input of the flip-flop for delaying the arrival of the first output signal.

A device according to the invention comprises at least one circuit containing a gate with at least two inputs for said signals, or signals derived from them, and one output for a first output signal, which is dependent on the phase position between the input signals. The circuit also contains a flip-flop having a first input for one of the input signals, or a signal derived therefrom, and a second input for the output signal from the gate. The flip-flop has an output for a second output signal.

By introducing the time delay circuit for one of the signals which is supplied to the flip-flop, the advantage is obtained that two signals cannot influence the flip-flop simultaneously or in an uncontrollable sequence, but one of the signals is delayed so much that a definite time of arrival at the flip-flop is always ensured. This makes possible a safe operation and identification of the phase position even with relatively simple circuits.

BRIEF DESCRIPTION OF THE DRAWINGS

On the accompanying drawing.

DESCRIPTION OF THE PREFERRED EMBODIMENTS

Figure 1:
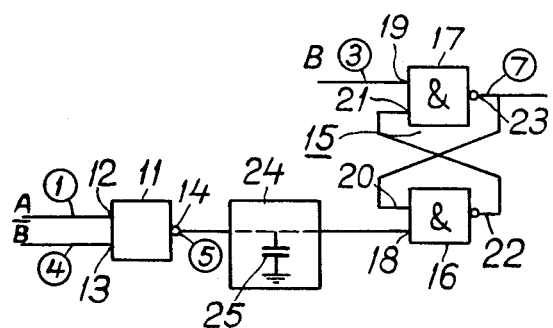
FIG. 1 shows a device for sensing the phase position, having one circuit.

The circuit illustrated in FIG. 1 comprises a NAND gate 11 and a bistable flip-flop 15. The gate 11 has a first input 12 and a second input 13 and an output 14. In the embodiment shown, the flip-flop 15 consists of two NAND gates 16 and 17. The gate 16 has a first input 18, a second input 20 and an output 22, whereas the gate 17 has a first input 19, a second input 21 and an output 23. The output of each gate is connected in a known manner to the second input of the second gate. Both the gate 11 and the flip-flop 15 are well-known and their mode of operation will therefore not be described here.

Figure 2:
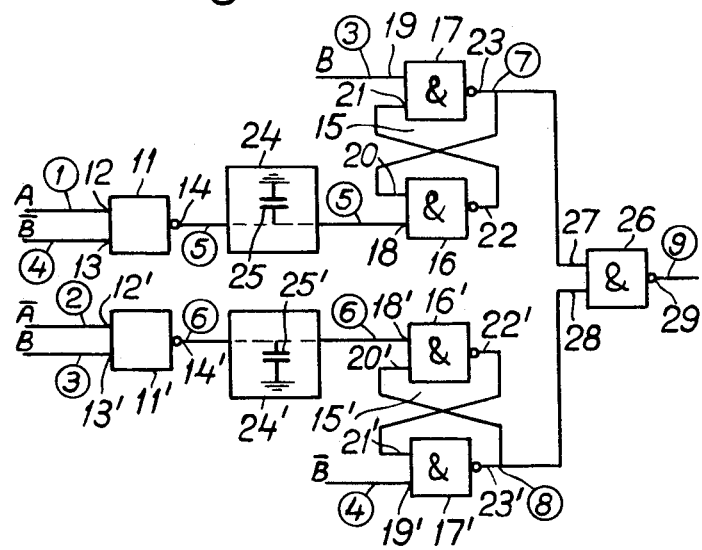
FIG. 2 shows a device with two parallel circuits.

The two signals, whose phase relations are to be determined, are designated 1 and 3. The signals, which from the start are sinusoidal, are assumed to be transformed into logic shape and therefore to appear as ones or zeros in conventional manner. Furthermore, there are assumed to be circuits for generating inverted signals 2 and 4, respectively, and signals which are composed of fundamental signals as well as inverted signals. In FIGS. 1 and 2 nine points are shown with the figure encircled by a ring. In these points characteristic signals appear, which are to be found with the corresponding figures in FIGS. 3 and 4.

In the circuit shown in FIG. 1, the signal 1 is supplied to the input 12 of the gate 11. This signal is indicated by an encircled 1. To the second input 13 of the gate the signal designated 4 is passed. This causes a signal designated 5 to appear on the output 14 of the gate. This signal is supplied to the input 18 of the gate 16 in the flip-flop 15 as one of the input signals of the flip-flop. To the input 19 of the gate 17 the signal B is supplied, which is designated 3. A signal 7 then appears on the output of the flip-flop.

Since both the input signals to the flip-flop are dependent on the signal 3 or signals derived therefrom, the result will be that at least once every period the input signals will invert their signs simultaneously. The change between zero and one in the output signal of the flip-flop will therefore in some situations be dependent on the individual characteristics of the gates included, and the signal will not always be definite. According to the invention, therefore, a delay of the time when the signal 5 changes from zero to one is introduced by inserting a time delay circuit 24, which may comprise a capacitor 25 as the delay element, in the connection between the output 14 of the gate 11 and the input 18 of the flip-flop 15. The size of the capacitor determines the time delay. In the curves for the signals 5 and 6 in FIGS. 3 and 4 there is shown in broken lines 10 how the flank which corresponds to a change from zero to one is displaced somewhat to the right, so that the change from zero to one always appears later in the signals 5 and 6 than in signals 3 and 4. This delay of signals 5 and 6 prevents an incorrect switching of the flip-flop because of an uncontrollable spreading of the functions of the various parts of the flip-flop.

Figure 3:
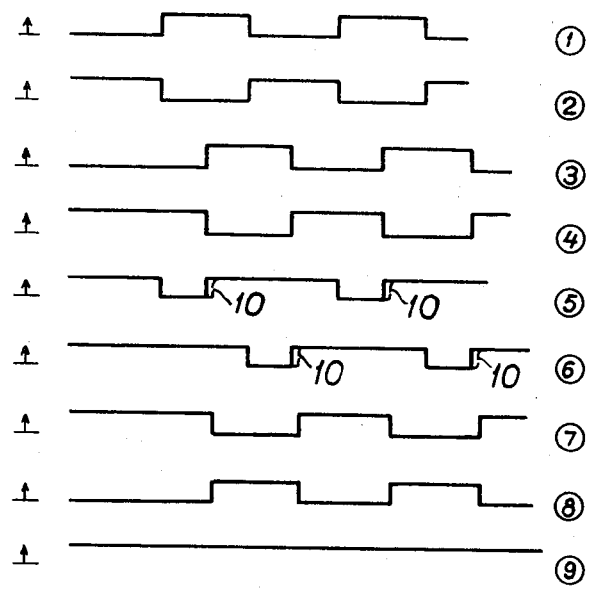
FIG. 3 shows the appearance of the signals at a number of points in the device at a certain position of the phase.

From FIG. 3 it is clear that if the signal in phase position 1 occurs before the signal in phase position 3 the signal 7 occurs on the output of the flip-flop 15 as negative pulses. If the signal in phase position 3 occurs prior to the signal in phase position 1, the output signal 7 becomes a continuous positive signal as appears from FIG. 4.

Figure 4:
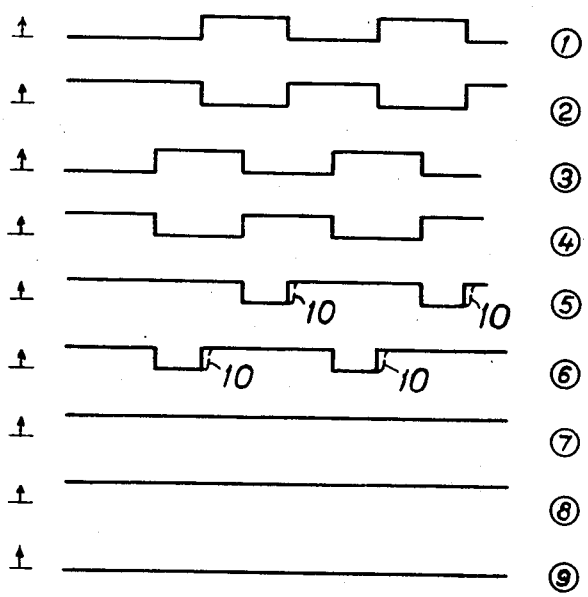
FIG. 4 shows the same as FIG. 3, but at the opposite phase position.

FIG. 2 shows the circuit shown in FIG. 1 and described above connected in parallel with another circuit of the same kind, where the various parts are given the same designations but with a prime sign as an addition. The output signal 7 from the flip-flop 15 and the output signal 8 from the flip-flop 15' are supplied as input signals to a NAND gate 26, on the output 29 of which an output signal 9 appears, the appearance of which in the two phase positions is clear from FIGS. 3 and 4. From this it will be clear that if the signal in phase position 1 occurs prior to that in 4, as shown in FIG. 3, the signal 9 becomes a continuous positive signal. If the signal in phase position 3 occurs prior to that in 1, the signal becomes a continuous negative signal, as shown in FIG. 4.

The signal 7 obtained from the output 23 in FIG. 1, and the signal 9 obtained on the output 29 in FIG. 2, respectively, are used in a known manner as an input signal to direction-sensitive relays or for indication or some other purpose.

The device can also be arranged for determining the phase position between more than two, for example three signals, which may be designated A, B and C; A and B, respectively, then corresponding to the signals 1 and 3, respectively, shown before. The gate 11 has then three inputs which are supplied with the signals A, C and B̄, where B̄ is equal to the previously shown signal 4. The output signal 5 from the gate will then become dependent on all three input signals in the same way as has been described before with respect to the signals 1 and 4, and 2 and 3, respectively.

With reference to FIG. 1, it is necessary, if there are more than two signals, that the signal 4 be last in phase, that is, all other signals must lie prior to the signal 4 in order to obtain the desired operation. If any signal lies behind 4, no output signal is obtained from the device. One or more of the input signals can, of course, be inverted prior to being passed to the gate 11 if the phase position 4 before these signals is to supply an output criterion.

We claim:

1. Device for determining the phase position between two signals (1,3), comprising at least one circuit which contains a gate (11,11') with at least two inputs (12,13;12',13') for said signals (1,2,3,4) and an output (14,14') for a first output signal (5,6) which is dependent on the phase position between the input signals, and a flip-flop (15,15') having a first input (19,19') for one of the input signals (3,4) or a complement signal thereof and a second input (18,18') for said first output signal (5,6), the connection between the gate (11,11') and the second input (18,18') of the flip-flop (15,15') containing a time delay circuit (24,24') for said first output signal (5,6).

2. Device according to claim 1, in which the time delay circuit (24,24') contains a capacitor (25,25') as a delay element.

3. Device according to claim 1, which comprises a first and a second circuit, the second circuit being fed with the inverted input signals of the first circuit and a NAND gate (26) with two inputs having one of its inputs (27) connected to the output (23) of the first circuit and its other input (28) connected to the output (23') of the second circuit.

* * * * *